United States Patent
Gilbert (10) Patent No.: US 7,711,333 B2
(45) Date of Patent: May 4, 2010

(54) DETECTOR WITH COMPLEMENTARY RESPONSE SLOPE

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 12/426,847

(22) Filed: Apr. 20, 2009

(65) Prior Publication Data

US 2009/0203336 A1 Aug. 13, 2009

Related U.S. Application Data

(63) Continuation of application No. 10/449,731, filed on May 29, 2003, now Pat. No. 7,546,098.

(51) Int. Cl.
*H01Q 11/12* (2006.01)

(52) U.S. Cl. .................... 455/126; 455/127.1; 330/129; 330/141

(58) Field of Classification Search ................ 455/126, 455/127.1; 330/129, 141
See application file for complete search history.

(56) References Cited

U.S. PATENT DOCUMENTS

| | | | |
|---|---|---|---|
| 4,053,846 A * | 10/1977 | Acker | ........................ 330/279 |
| 4,335,361 A * | 6/1982 | Acker | ........................ 330/285 |
| 4,891,605 A | 1/1990 | Tirkel | |
| 4,990,803 A | 2/1991 | Gilbert | |
| 5,057,717 A | 10/1991 | Kimura | |
| 5,128,629 A | 7/1992 | Trinh | |
| 5,298,811 A | 3/1994 | Gilbert | |
| 5,345,185 A | 9/1994 | Gilbert | |
| 5,369,789 A | 11/1994 | Kosugi et al. | |
| 5,371,473 A | 12/1994 | Trinh et al. | |
| 5,489,868 A | 2/1996 | Gilbert | |
| 5,570,055 A | 10/1996 | Gilbert | |
| 5,572,166 A | 11/1996 | Gilbert | |
| 5,745,523 A * | 4/1998 | Dent et al. | ................... 375/216 |
| 6,144,244 A | 11/2000 | Gilbert | |
| 6,321,072 B1 | 11/2001 | Cipriani et al. | |
| 6,728,520 B2 | 4/2004 | Coan et al. | |
| 6,920,188 B1 | 7/2005 | Walker et al. | |
| 6,975,838 B1 | 12/2005 | Rofougaran et al. | |
| 7,110,349 B2 * | 9/2006 | Branlund et al. | ............. 370/203 |
| 7,430,257 B1 * | 9/2008 | Shattil | ......................... 375/347 |
| 7,593,449 B2 * | 9/2009 | Shattil | ......................... 375/130 |
| 2004/0266371 A1 | 12/2004 | Summers et al. | |

OTHER PUBLICATIONS

Gilbert, Barrie, "Monolithic Logarithmic Amplifiers," Rev. 1.7 27-28, Aug. 1994, pp. 1-122.
PCT/US04/16447 International Search Report and Written Opinion of the International Searching Authority, Oct. 10, 2008, 2 pages.

* cited by examiner

*Primary Examiner*—Nay A Maung
*Assistant Examiner*—Richard Chan
(74) *Attorney, Agent, or Firm*—Marger Johnson & McCollom, P.C.

(57) ABSTRACT

A measurement signal from a detector may have a complementary polarity. For example, an RF power detector may generate an output signal that decreases in magnitude in response to an increasing input signal. In one embodiment, the RF power detector may include a series of transconductance detector cells arranged to progressively turn off as the input signal becomes progressively larger.

2 Claims, 11 Drawing Sheets

DETECTOR WITH COMPLEMENTARY RESPONSE SLOPE

This application is a continuation of U.S. patent application Ser. No. 10/449,731 filed May 29, 2003 entitled Control System With Selective Open-Loop Operation, which is incorporated by reference.

BACKGROUND

In standard wireless communication systems, data is sent from a transmitter to a receiver by modulating the data onto a radio frequency (RF) carrier signal. In radio telephony, multiple users share a narrow range of frequencies assigned by prior agreements. Because spectrum space is severely limited, the modulation techniques chosen for digital telephony are of crucial importance, and are designed to transmit the highest amount of data within the narrow confines of a small sub-range of the total spectrum allocated for a particular service provider.

The Global System for Mobile (GSM) telephony prescribes standards for modulating data from multiple users onto a composite RF carrier. In GSM, packages of digital data are sent in modulated periods of RF power called "bursts", transmitted at regularly-spaced intervals during a sequence of "time slots", allocated to different users (at different carrier frequencies). The power of the transmitted carrier remains constant during each burst, because the data is modulated onto the carrier using a constant-amplitude technique that varies only its phase.

Figure 1:
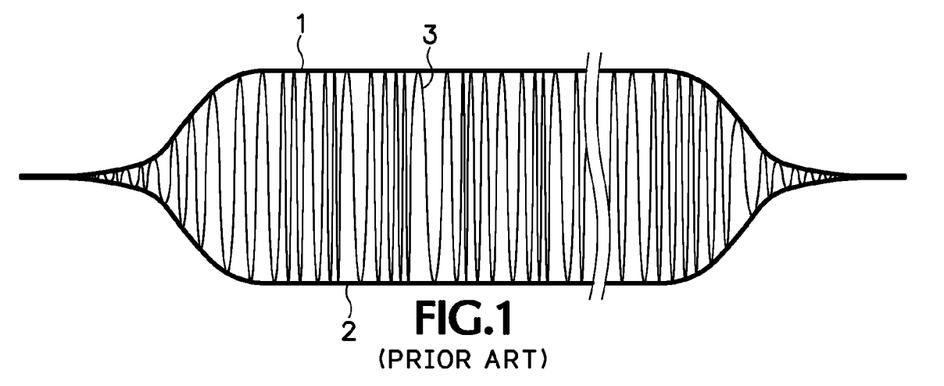
FIG. 1 illustrates a typical data burst in a GSM carrier signal.

FIG. 1 illustrates a typical GSM burst. The outer boundaries 1 and 2 of the burst form a conceptual "envelope" within which the high-frequency (usually between 0.8 and 2.2 GHz) carrier signal 3 is modulated. The amplitude of the signal begins at essentially zero and ramps up during an initial period of about 20 microseconds ($\mu s$). The amplitude is then held constant for about 560 $\mu s$ after which it is ramped back down to zero. The controlled-rate ramp-up and ramp-down portions of the signal are included to prevent interference between adjacent channel frequencies. If the power level of each burst increased or decreased almost instantaneously to its final value, spurious high-frequency harmonics would be generated, causing significant power to appear outside of the band assigned to a certain channel. In severe cases, the power transmitted in adjacent channels, or even channels at more remote frequencies, would exceed the limits prescribed by the regulatory body (for example, the FCC in the USA).

During the data burst interval, the transmitted power must be accurately controlled to conform to GSM and relevant regulatory standards. If the signal is transmitted with too little power, the link between the transmitter and receiver will be lost, when the bit error rate (BER), caused by noise in the receiver, exceeds a limit above which error correction is no longer possible. If the signal power is too high, it may interfere with adjacent channels (due to receiver selectivity limitations), or violate regulatory limits, or reduce "talk time" in a battery-powered handset. Thus, the power control in either a base-station or handset transmitter demands the use of very accurate circuitry.

Figure 2:
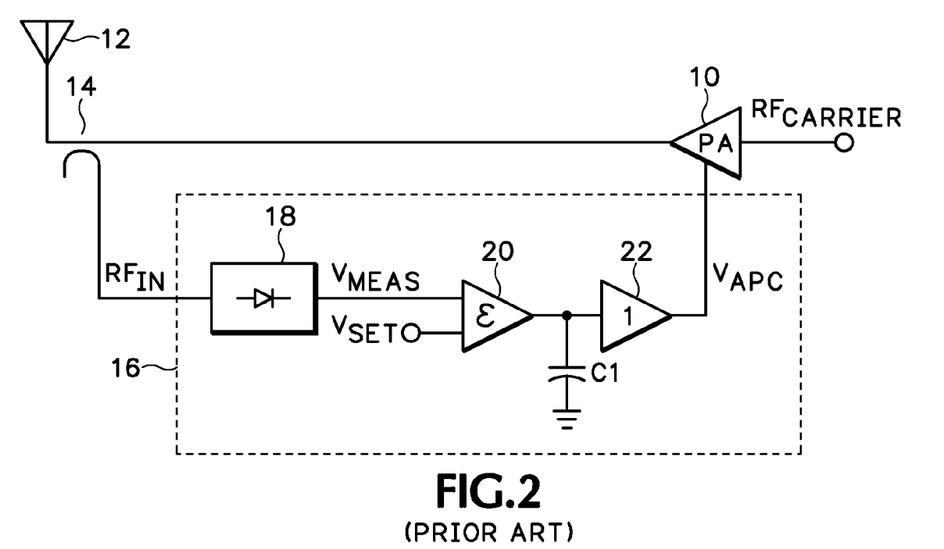
FIG. 2 illustrates a prior art system for controlling a power amplifier in a GSM system.

FIG. 2 illustrates a prior art system for controlling the power of an RF telephony system. A power amplifier (PA) 10 drives an antenna 12 with an RF output signal which it generates by amplifying a lower-power RF carrier signal that has data modulated thereon. The amount of power gain is controlled by an Automatic Power Control signal $V_{APC}$. A directional coupler 14 extracts the signal $RF_{IN}$ which is an attenuated sample of the output power of the PA flowing toward the antenna. The control system 16 includes a detector 18 which transforms this RF sample to a corresponding baseband signal $V_{MEAS}$, to provide a measurement of the power delivered to the antenna. The detector can use a simple diode circuit, a logarithmic amplifier (log amp), an amplitude-squaring cell, which may or may not be preceded by an amplifier, or other suitable detector. A comparison element 20 generates an error signal $I_{ERR}$ which represents the difference between the actual signal measurement, $V_{MEAS}$, and the "set-point" signal, $V_{SET}$, which determines the desired antenna power. This deviation between the signal representations of actual and desired power, in this example assumed to be in current form, is integrated by a capacitor C1 and buffered by an amplifier 22, usually having a small non-inverting gain, which provides the power-control signal, $V_{APC}$, for use by the PA. The comparison element, integrating capacitor and buffer amplifier can collectively be viewed as an error-nulling circuit.

The set-point signal $V_{SET}$ is an independent variable, accurately scaled to conform to the design parameters of the overall detector sub-system. For example, if the detector is based on a logarithmic amplifier (log amp), the design parameters are the logarithmic slope and intercept. Whenever a certain $V_{SET}$ is applied to the set-point input, the control loop adjusts the output from the PA until the input to the detector corresponds very closely to the demand level represented by the set-point signal. On the other hand, the signal generated by the detector system, $V_{APC}$, which controls the PA, is the buffered output from the error integrator. $V_{APC}$ assumes the generally imprecise value needed by a variety of PA types to provide the power required to satisfy the set-point demand, as represented by $RF_{IN}$.

The generalized detector system of FIG. 2 is readily adaptable for use in RF power control for GSM modulation. A log amp is especially suited as the detector element, since it provides a wide measurement range (typically up to 60 dB, which is a 1000:1 range in transmitted power). Being essentially an envelope detector, it responds to the modulation envelope of the data bursts. In GSM telephony, the aforesaid ramping process is controlled within the transmitter, usually by generating a time-sequence of values in software which are transformed into a voltage waveform using a Digital-to-Analog Converter (DAC). Since the system of FIG. 2 is designed to maintain closed-loop power control continuously, from the beginning of the ramp-up, throughout the data burst interval, and during the ramp-down, it is well-suited to the basic GSM modulation format, in which the RF signal has a constant power amplitude during the burst.

DETAILED DESCRIPTION

This patent encompasses numerous inventions relating to signal measurement and control. For convenience, the various inventions disclosed in this application are sometimes referred to collectively or individually as "the present invention". It will be understood, however, that these inventions have independent utility and are independently patentable. In some cases, additional benefits are realized when some of the principles are utilized in various combinations with one another, thus giving rise to yet more patentable inventions.

These principles can be realized in numerous different embodiments. Only the preferred embodiments are described below. Although some specific details are shown for purposes of illustrating the preferred embodiments, other equally effective arrangements can be devised in accordance with the inventive principles of this patent application. Thus, the inventive principles are not limited to the specific details disclosed herein.

EDGE Modulation Technique

As discussed above, conventional GSM is a standardized technique for modulating data wherein the amplitude of the carrier signal remains constant. An extension of GSM is currently being developed to increase the data rate of a modified GSM system. This extension is referred to as Enhanced Data GSM Extension, or "EDGE". EDGE does not use a constant-envelope amplitude. Rather, the data encoded on the RF signal causes its power level to vary considerably during the burst interval; that is, the burst has an amplitude modulation component. The general form of the variation in amplitude has the appearance of random noise, a consequence of the pseudo-random data format. The power variation in a transmitter is more extreme than in a hand-set, since the former is generating carriers for many users at varying distances from the base-station. These factors complicate the challenge of power control for EDGE transmitters of both types, and preclude the use of the afore-stated methods.

In controlling power for EDGE transmission, it is the average power that must be accurately determined and controlled. However, this raises an immediate difficulty, since the control loop must still respond quickly during the ramp-up and ramp-down periods, yet not be responsive to the large variations in amplitude during the burst. Furthermore, this measurement function cannot be served by somehow increasing the integration time-constant during the burst interval, because it would not be possible to acquire a true measure of the average value within the duration of the burst, and the transmitted power would thus vary during the burst as the control system tries to find the error-null condition.

Figure 3:
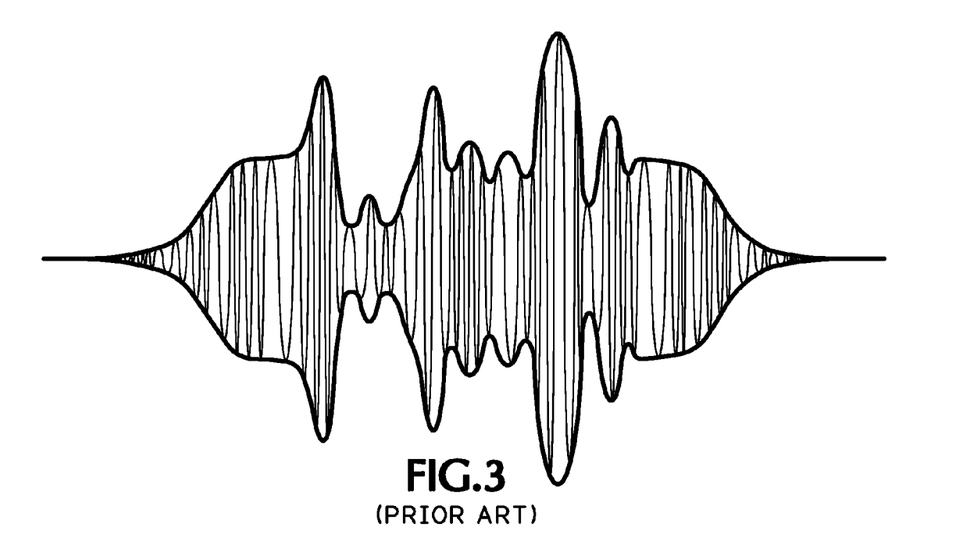
FIG. 3 illustrates a typical data burst in an EDGE carrier signal.

FIG. 3 illustrates a typical burst in an EDGE signal in a simplified form. As in GSM, an EDGE burst has a data interval of about 560 μs, and power is ramped up to its operating level within about 20 μs. There is a brief plateau at the top of the ramp but before the "data preamble" begins, during which the signal first varies in amplitude, but in a predictable way, followed by the user-specific data, which appears as deep amplitude modulation of essentially random form for most of the burst interval. Two other periods of less severe and more predictable modulation occur at the "midamble", near the middle of the burst, and the "postamble" at the end, and just prior to the ramp-down.

Figure 4:
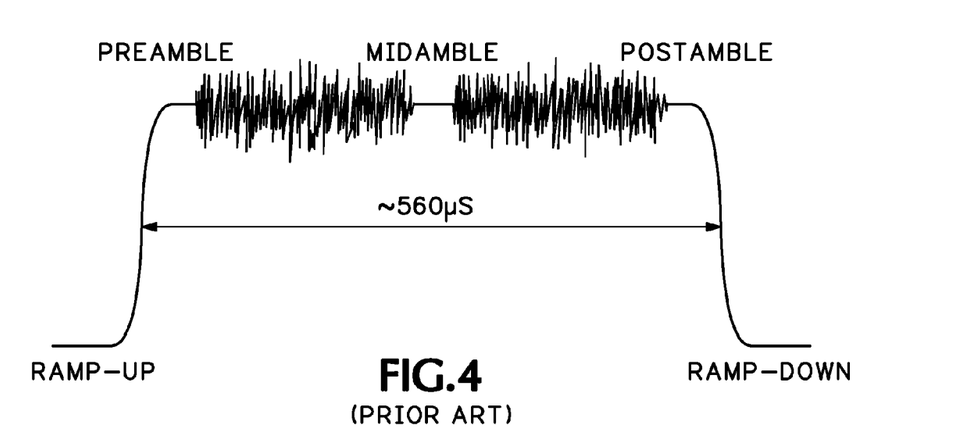
FIG. 4 illustrates the power profile of a typical data burst in an EDGE carrier signal.

During most of an EDGE burst, however, the complex modulation format requires variations in both the phase and amplitude of the carrier. The waveforms in FIG. 3 are by no means to scale, and the horizontal axis is especially drawn out to better illustrate this complex modulation. On a more realistic time scale such as that shown in FIG. 4, the envelope of an EDGE burst has the appearance of random noise.

This modulation will pose problems to the control system shown in FIG. 2 because the variations in amplitude will perturb the control loop in a manner that it was not intended, or is able, to accommodate. If the bandwidth of the control loop were designed to be very wide, by reducing the integration time-constant, the amplitude modulation would in the limit case be eliminated, because the control loop would then be constantly trying to assert a constant output power corresponding to the set-point. Thus, the control system must "ignore" these amplitude fluctuations, while maintaining the average power within stringently regulated limits. When this is achieved, other aspects of the EDGE modulation format will ensure that the peak power also remains within such limits.

A proposed technique for controlling an EDGE signal might be to use different time constants during different portions of the full burst interval. Since the value of the integrating capacitor $C_{AVE}$ determines the response bandwidth (thus, rise- and fall-times) for the closed loop control system, it might be thought that some method which increases $C_{AVE}$ (either actually, by switching another capacitor in parallel with it, or effectively, by electrically altering some other element in the control path) could provide the needed reduction in bandwidth, so as to provide a more accurate measurement of the average power during the burst.

This method fails, however, because only if the loop bandwidth were reduced to zero would the control voltage $V_{APC}$, and thus the output power, be truly constant. If increased by a more moderate amount, the low-pass filtering of the random amplitude would generate an undesired variation in $V_{APC}$ during the burst. There thus appears to be an intractable dilemma.

Additional complications can be cited. For example, if the aforementioned switched-capacitor technique were employed, it would need to be pre-charged to just the right voltage prior to the instant it is connected, just before the start of the random amplitude modulation. Otherwise, a sudden glitch would appear in $V_{APC}$, generating unacceptable sidebands in the RF carrier. The detailed design considerations of such a circuit method prove it to be unwieldy.

A more promising strategy according to the present invention is to completely disconnect the measurement section of the detector from the integrator as soon as the ramp-up phase is completed, thus holding $V_{APC}$ at a constant value during the burst interval, until the ramp-down phase, when the control loop must again be closed. That is, the apparently contradictory requirements, of providing a fast response during the ramp-up and ramp-down phases but a very slow response during the data interval, can be met by using a track-and-hold technique. To accommodate this scheme, transmitter system-at-large provides a suitable gating pulse at the correct times.

It should be noted that this solution is applicable to other modulation formats, such as Code Division Multiple Access (CDMA), where amplitude modulation is present.

A further shortcoming of prevalent control system arises from the fact that power amplifiers in general do not provide a linear relationship between $V_{APC}$ and their output power, $P_{OUT}$. This effect is a strong one: the incremental gain, stated as $\Delta P_{OUT}/\Delta V_{APC}$, may typically vary by a factor of over 200:1 in a hand-set PA. Consequently, the dynamic response (rise- and fall-time) of the control loop can vary from very fast at low powers (where $\Delta P_{OUT}/\Delta V_{APC}$ is highest), to very slow at high powers (where $\Delta P_{OUT}/\Delta V_{APC}$ may be 200 times smaller). Thus, another aspect of the present invention is a scheme to compensate for this large variation in control loop bandwidth in an advanced control system, whether for GSM, EDGE, CDMA, etc.

Power Control-Loop Track-and-Hold Technique

Some of the inventive principles of this patent application relate to operating a control system in an open loop mode during selected portions of a data burst, rather than trying to measure the average value of the amplitude-modulated carrier during the data interval of an EDGE burst. In one aspect of the present invention, $V_{APC}$, and thus the transmitted power, can be held at a constant level corresponding to that attained at the end of the ramp-up period, by the application of a gating pulse. The control loop can then be restored to closed-loop operation at any suitable later time, which invariably will be just prior to the ramp-down period. This method eliminates the dilemma of determining the average output power of the amplitude modulated signal during the data interval and leaves the output of the power amplifier at, or very near, the level from which to begin the ramp-down under closed-loop control without causing an abrupt change (glitch) in the power.

Figure 5:
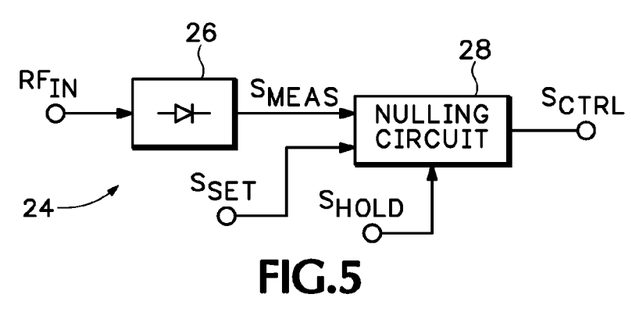
FIG. 5 illustrates an embodiment of an RF power control system according to the present invention.

A possible implementation of such a technique is shown in FIG. 5, which illustrates an embodiment of an RF power control system 24 according to the present invention. The system of FIG. 5 includes an RF detector 26 which generates a measurement signal $S_{MEAS}$ in response to its input signal $RF_{IN}$. The RF detector can be a log amp (which provides a convenient decibel-scaled measurement of the carrier envelope), a squaring cell (which provides a true-power, that is, RMS measurement), a simple diode detector (whose response is not of either precise form), or other suitable detector. A nulling circuit 28 generates the control signal $S_{CTRL}$ by integrating, averaging, or otherwise applying a relatively long time-constant to the difference between the measurement signal and a set-point signal $S_{SET}$. The nulling circuit is also constructed and arranged to allow the control loop to be opened in response to a hold signal, the logic level $S_{HOLD}$, which results in the power amplifier control signal being held at a constant value when the hold signal is asserted. For illustrative purposes only, we here make the closed-loop condition correspond to a logic 'LO' level, and the hold condition correspond to a logic 'HI' level. That is, the hold signal is HI when it is asserted.

The hold signal can be obtained from any suitable source. For example, if the control system of FIG. 5 is used to drive a power amplifier in an RF transmission system using EDGE modulation, the hold signal can be obtained from the microprocessor that is typically used to generate the time-sequence of values for generating the ramp-up and ramp-down signals which would be used as the set-point input. The output from the signal coupler is then used as the RF input to the detector, and the control signal is used as the automatic power control signal $V_{APC}$.

Figure 6:
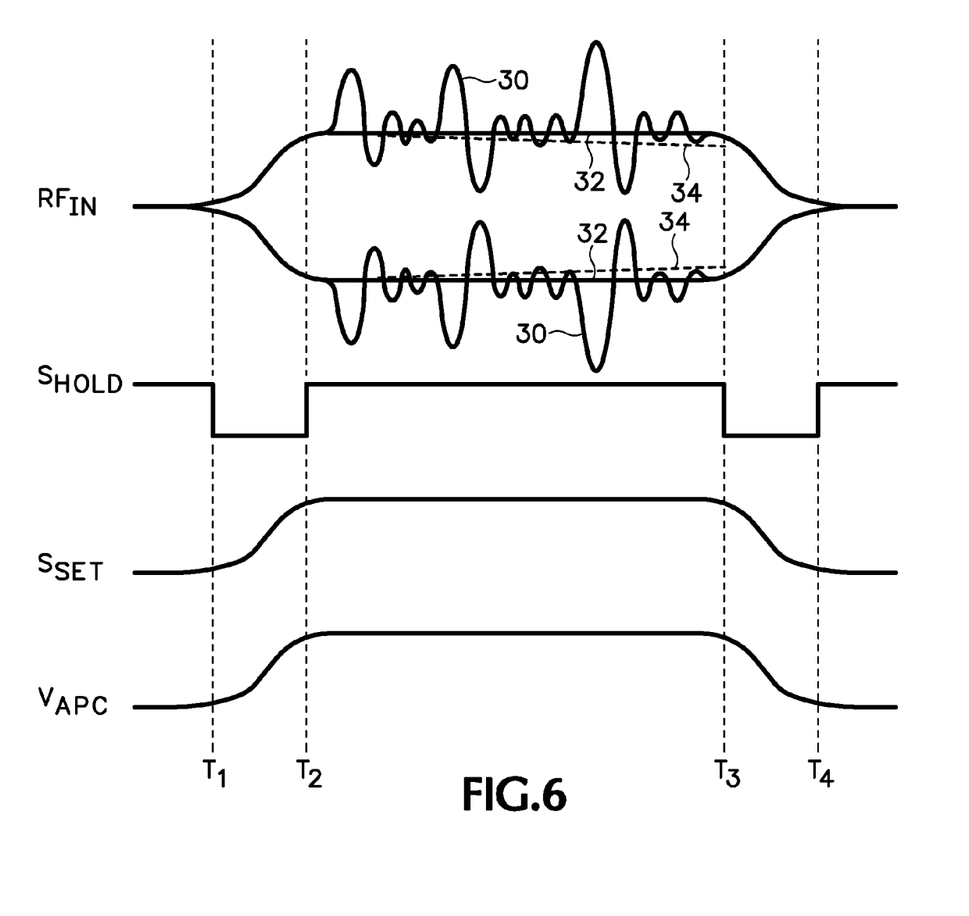
FIG. 6 illustrates how a control signal hold technique according to the present invention might be utilized in an RF transmission system using EDGE modulation.

FIG. 6 illustrates how a control signal hold technique according to the present invention might be utilized in an RF transmission system using EDGE modulation. At some time prior to $T_1$ the set-point signal $S_{SET}$ is at, or close to, zero, the hold signal is 'HI', and the control signal $V_{APC}$ assumes a low value corresponding to essentially zero output from the PA. At time $T_1$, the ramp-up waveform is applied to the set-point input, while the hold signal remains 'LO', that is, the control loop is closed. The system operates in this closed-loop mode, driving the control signal $V_{APC}$ with whatever value is necessary to force the envelope of the RF input signal to match the increasing power demanded by the set-point signal. The waveform of $V_{APC}$ has only roughly same form as the set-point signal, but distorted by the aforementioned nonlinearity in the PA control response, which is further discussed below.

At time $T_2$, the hold signal is taken 'HI', thereby causing the control signal $V_{APC}$ to remain at the same level as when the ramp-up phase ended. Thus, the amplitude variations 30 are ignored during the data interval, and $V_{APC}$ is held at the level to which it would have been regulated if the RF input signal had a constant amplitude thereafter, as shown by the solid lines 32 in FIG. 6. At time $T_3$, when the data interval is completed, the hold signal is again taken 'LO', a ramp-down sequence of values is applied to the set-point input, and the output of the power amplifier is ramped back down to essentially zero under accurate closed-loop control.

During the open-loop period, the control signal $V_{APC}$ is preferably, though not necessarily, held as constant as possible. If the control signal droops during this time, the RF input signal will also droop as shown by the broken lines 34 in FIG. 6. The measurement signal will then droop by a corresponding amount which, in turn, will cause a discontinuity when the loop is closed again. It should be noted that many power amplifiers suffer from slight variations in output power as their internal temperature increases during the burst, when they are operating at a fixed $V_{APC}$. The typically much smaller amount of hold droop in $V_{APC}$ thus poses no significant new threat to power accuracy.

Figure 7:
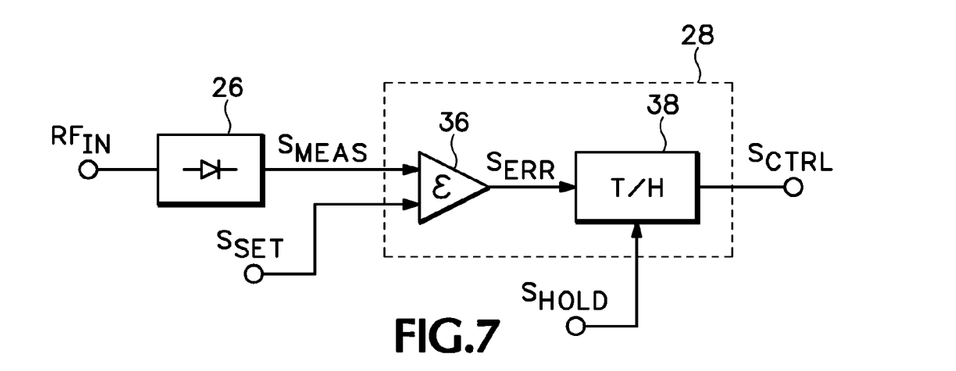
FIG. 7 illustrates a possible embodiment of a nulling circuit according to the present invention.

FIG. 7 illustrates more details of one possible embodiment of the nulling circuit of FIG. 5. The nulling circuit 28 includes an error generator 36 and a track/hold stage 38. The error generator generates the error signal $S_{ERR}$ in response to the difference between the measurement signal $S_{MEAS}$ and the set-point signal. The track/hold stage has two basic modes of operation. When the hold signal is held 'LO' (track mode), the error signal is conveyed to the integrating capacitor, and the buffer amplifier provides the control signal $V_{APC}$. When the hold signal is taken 'HI' (hold mode), the error signal (which will now vary considerably during the data burst) is prevented from reaching the capacitor. This holds the control signal $V_{APC}$ at a constant level corresponding to the value just prior to when the hold mode was asserted. When returned to the tracking mode, the control loop resumes its integration of the error signal, and operates in a closed-loop manner. As used herein, the term "integration" refers not only to a true integration function, of the form $1/s\tau$, but also to averaging, or otherwise applying a relatively long time-constant, for example, any function that provides a more complex function of a similar type such as by inclusion of a transmission zero, of the form $(1+ks\tau)/s\tau$.

Figure 8:
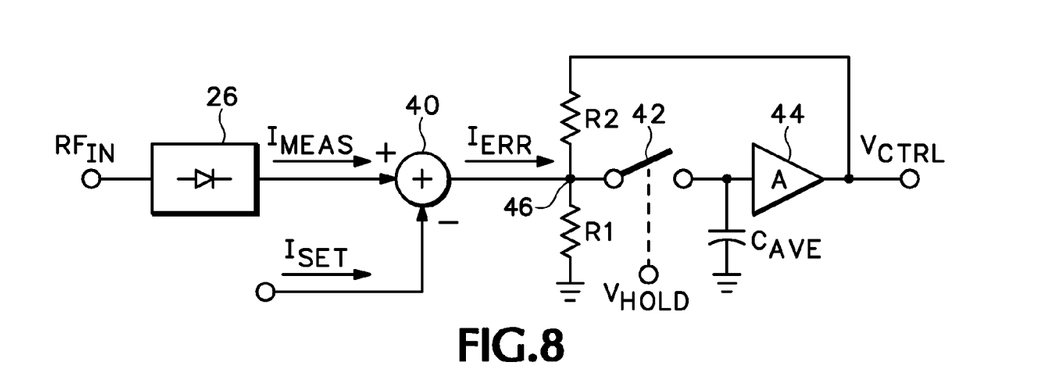
FIG. 8 illustrates another embodiment of an RF control system according to the present invention.

FIG. 8 illustrates another embodiment of an RF control system according to the present invention. In the embodiment of FIG. 8, the measurement, set-point and error signals are implemented as currents $I_{MEAS}$, $I_{SET}$ and $I_{ERR}$, respectively. The error generator is shown as a differencing circuit 40 which generates the error current $I_{ERR}$ by subtracting $I_{SET}$ from $I_{MEAS}$. The track/hold stage includes a switch 42 that couples the error signal to the integrating capacitor $C_{AVE}$ in response to the hold signal. Buffer amplifier 44, having very low input bias current, and an optional voltage gain A, (where A may be <1, 1 or >1) accepts the voltage on $C_{AVE}$, with or without voltage gain, to generate $V_{APC}$, a low-impedance control signal. The buffer may be eliminated, for example, if the power amplifier control input provides a similar high-impedance input.

During the hold mode, the switch is opened, and the control signal is held at the voltage present on the capacitor at the time just before the switch was opened. During track mode, the switch is closed, and $C_{AVE}$ integrates the error current, and the resulting voltage appearing across the capacitor provides $V_{CTRL}$ which may be used as $V_{APC}$. $C_{AVE}$, in conjunction with the overall effective transconductance of the preceding sections of the detector, set the integration time-constant, $\tau_D$. When operating in a closed-loop manner, $\tau_D$ gives rise to a certain closed-loop bandwidth for the overall control system, in conjunction with the effective gain from $V_{APC}$ through the power amplifier and coupler to the sample $RF_{IN}$. As previously noted, this forward-path gain is generally a very non-linear function of $V_{APC}$.

The system of FIG. 8 also includes the optional elaboration of a restraining circuit that holds the output of the differencing circuit close to the same voltage as the capacitor when the switch is open. If unconstrained, the output of the differencing circuit can drift to an arbitrary voltage, which might cause a glitch in the capacitor voltage, and thus in $V_{APC}$, when the switch is next closed. This scheme preferably utilizes a buffer gain A≧1.

The embodiment of the restraining circuit shown in FIG. 8 includes a first resistor R1 coupled between the output of the adding circuit (node 46) and ground, and a second resistor R2 coupled in a feedback configuration between node 46 and the output of the buffer 44. If the resistor values are chosen so that $(R_1+R_2)/R_1=A$, then node 46 will be held close to the same average voltage as that across capacitor $C_{AVE}$, in the presence of the variations caused by the amplitude modulations from the $I_{MEAS}$ signal.

Figure 9:
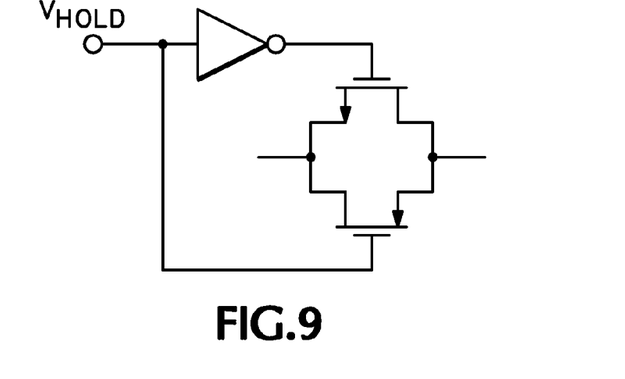
FIG. 9 illustrates an embodiment of a CMOS switch according to the present invention.

FIG. 9 illustrates an embodiment of a CMOS switch that would be suitable for use as the switch 42 in FIG. 8. The switch shown in FIG. 9 utilizes balanced NMOS and PMOS devices to minimize charge injection into the capacitor during switching, which would cause step changes in $V_{APC}$ that can cause spurious sidebands in the carrier signal.

Gain Linearity Compensation

Some additional inventive principles of this patent application relate to techniques for compensating for nonlinearity in the gain-control sensitivity of some RF power amplifiers.

As mentioned above, the relationship between $V_{APC}$ and the output power of a typical RF power amplifier is extremely nonlinear. This dramatically alters the control loop dynamics (that is, its instantaneous, incremental bandwidth), both during the ramp-up and ramp-down phases, and over the full range of final power values, thereby preventing optimization of the loop behavior in the time-domain.

Figure 10:
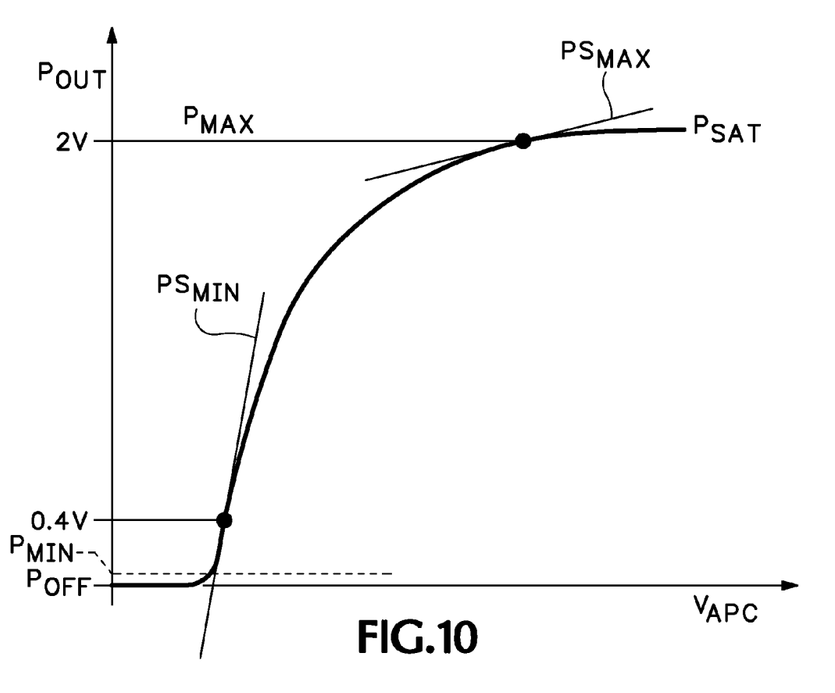
FIG. 10 illustrates the relationship between the output power and the control voltage for a typical prior art power amplifier.

FIG. 10 illustrates the relationship between the output power $P_{OUT}$ and the control voltage $V_{APC}$ for a typical power amplifier as used, for example, in a wireless handset. The incremental slope of the curve at an output power $P_O$ is defined as $S_{PA}=\Delta P_{OUT}/\Delta V_{APC}$. At $P_{MAX}$, the slope $S_{MAX}$ is small, and the open-loop gain of the control loop is minimal. At $P_{MIN}$, the slope $S_{MIN}$ is high, and the open-loop gain is maximal. For some power amplifiers, the incremental slope can vary over a range as high as 200:1 between $P_{MIN}$ and $P_{MAX}$.

Figure 11:
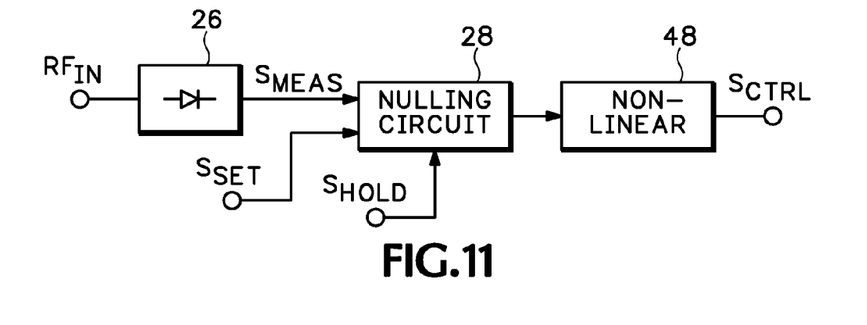
FIG. 11 shows another embodiment of an RF control system in accordance with the present invention.

A possible technique for compensating this gain nonlinearity is the use of a nonlinear element between the output $V_{APC}$ and the power amplifier's control input. The nonlinearity of such a voltage-in/voltage-out element would be chosen as the inverse of the PA gain-control nonlinearity. This technique is illustrated in FIG. 11 which shows an embodiment of an RF control system in accordance with the present invention. The system of FIG. 11 is similar to the embodiment of FIG. 5, except now a nonlinear stage 48 is arranged between the nulling circuit and the control signal output.

While the nonlinear stage 48 would ideally impart a correction to the control signal that is the exact inverse of the power amplifier's gain control characteristic, even an approximation can provide a useful improvement. As $V_{APC}$ increases, the gain of the nonlinear element increases by the required amount to compensate for the reduced gain sensitivity of the power amplifier at the high end of its operating range. However, this technique is generally less effective than desired, due to the variety of differing nonlinearities exhibited by various power amplifiers and the attendant difficulty of adjusting the nonlinearity of a general-purpose control system for each specific PA. The nonlinearity and gain sensitivity are also invariably temperature-dependent.

Some additional inventive principles of this patent application relate to varying the forward path gain of an RF control system, in an inverse-function manner, ahead of the integrator. In this approach, no attempt is made to create a static voltage-in/voltage-out non-linearity. Rather, the effective integration time-constant, $\tau_D$, is arranged to be varied in the equivalent manner, so as to maintain a constant control-loop bandwidth. If $\tau_D$ is programmed via a further control signal applied to the control system, adaptation to any PA nonlinearity can now be readily achieved in the transmitter software using an appropriate look-up table, which optionally can include temperature compensation.

Figure 12:
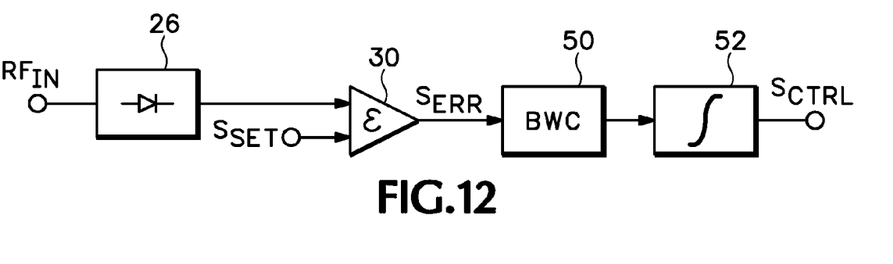
FIG. 12 illustrates another embodiment of an RF control system according to the present invention.

One possible system for implementing such a technique is shown in FIG. 12 which illustrates another embodiment of an RF control system according to the present invention. The system of FIG. 12 includes a detector 26 followed by a nulling circuit having an error generator 30 and an integrator 52. Added to this is a bandwidth compensation element 50 between the error generator and the integrator. The bandwidth compensation element alters the forward-path gain of the control system, specifically, in this example, its effective transconductance, prior to integration and in response to a stimulus (for example, a voltage input) that is suitably coordinated with the nonlinear gain sensitivity of the apparatus being controlled. In the case of an RF power amplifier, the stimulus is programmed to alter the forward gain (transconductance) of the pre-integration sections of the control system in a manner that ideally maintains a constant bandwidth for all power output levels, as the incremental control slope $S_{PA}$ of the power amplifier varies.

Whereas the use of a nonlinear stage after the integrator as shown in FIG. 11 may be viewed as a "DC solution" (because the shape of the nonlinearity is fixed, and embedded in a voltage-in/voltage-out element) the use of a compensation element before the integrator may be viewed as an "AC solution" (i.e., compensation in the AC domain) because it is the effective integration time-constant that is varied to maintain a constant closed-loop AC response (that is, a constant pole-zero location) in the overall control system, the most salient attribute of which can be identified as a constant control-loop bandwidth. This control of the integration time-constant is preferably implemented through the use of an analog voltage interface.

The principles of compensation in the AC domain are independent of other inventive principles of this patent application. In this connection, it should be noted that the nulling circuit shown in FIG. 12 does not include a track/hold stage, but only an integrator, which again, refers to a true integrator, of the form $1/s\tau_D$, or some other apparatus that may provide averaging, or other type of relatively long time-constant, for example, a more complex function of a similar type such as a network that includes a transmission zero, of the form $(1+ks\tau_D)/s\tau_D$. Nevertheless, a gain compensation scheme according to the present invention may be used in combination with the track and hold principles discussed above, to provide the additional benefits described relevant to EDGE and CDMA applications.

Figure 13:
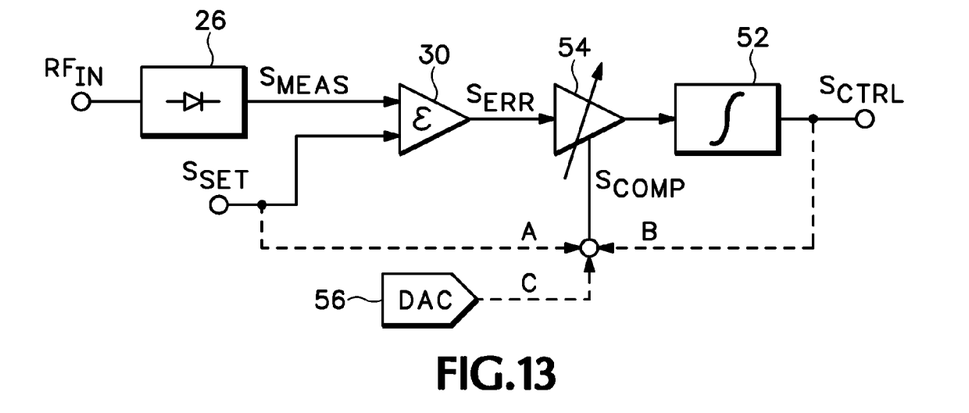
FIG. 13 illustrates another embodiment of an RF control system according to the present invention.

Some of the various stimuli that can be used to control the bandwidth compensation stage are shown in FIG. 13 which illustrates another embodiment of an RF control system according to the present invention. In the embodiment of FIG. 13, the bandwidth compensation stage is implemented as a variable transconductance element 54 controlled by the compensation control signal $S_{COMP}$. One possible source of $S_{COMP}$ is from the set-point control signal as shown by the broken path "A". Another possible source of $S_{COMP}$ is from the output $V_{APC}$ in a typical power amplifier control system, and which is shown by the broken path "B" in FIG. 13. Yet another possible source of $S_{COMP}$ is from an auxiliary DAC, which can be used to optimally stabilize the loop-bandwidth under software control. This possibility is illustrated by broken path "C" in FIG. 13 and can be viewed as a technique in which any control system bandwidth within the available design range may be realized, thereby providing a completely general, fully-programmable solution, which optionally may include compensation for ambient (system) temperature variations as well as those temperature variations caused by self-heating in the power amplifier, and any alterations needed to adapt a transmitter to new services as they arise over time. It can be appreciated that this flexibility is not possible using the fixed "DC solution" previously described.

Figure 14:
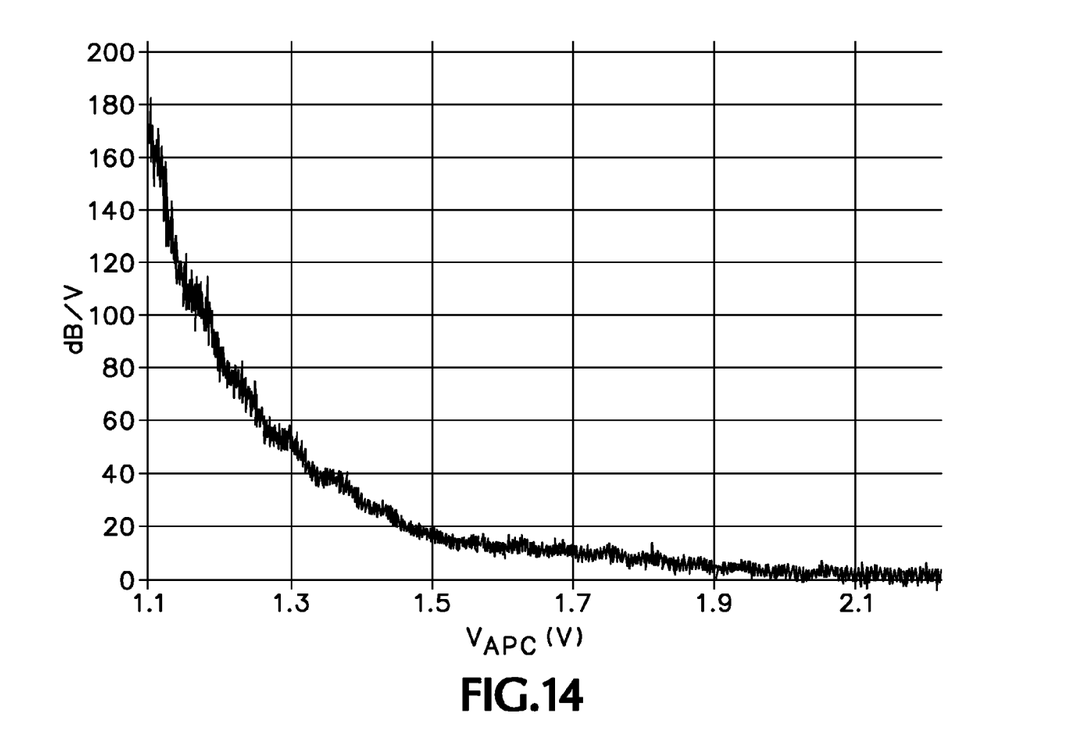
FIG. 14 illustrates the incremental slope of a typical prior art power amplifier.

A bandwidth compensation system according to the present invention can be further refined by arranging the effective transconductance to have a specific nonlinear response that provides a wide range of variation in the transconductance, appropriately suited to compensate for the large variation in $S_{PA}$ (typically 200:1), in response to a readily-generated range of control signals. The most convenient form of this nonlinearity is the exponential, more generally referred to as "linear-in-dB", and the most convenient control mode is that provided by a differential-input voltage interface. Furthermore, a well-developed implementation of such an interface will also be precisely scaled, as so many decibels per volt, and temperature-stable. The use of a linear-in-dB response, in addition to providing wide gain variation, has additional benefits. As discussed above with reference to FIG. 10, the incremental slope of a typical power amplifier varies dramatically over its operating range. FIG. 14 illustrates the incremental slope of a typical power amplifier in decibels per volt as a function of the control signal $V_{APC}$. Since this function has an approximately logarithmic form, the use of an inverse (exponential) form for the control system's transconductance provides a better basic fit for the compensation purposes than would be obtained by a system having a linear transconductance response to the compensation signal, $S_{COMP}$.

Therefore, if the transconductance element 54 shown in FIG. 13 is constructed so that it multiplies the error signal by an exponential function of the compensation signal, as explained in more detail below, the control system bandwidth will be almost constant as the output of the power amplifier varies over its full range, even before any detailed correction is added.

Complementary Detector Response Slope

Some additional inventive principles of this patent application relate to techniques for improving the absolute accuracy of power measurement in an RF control system by changing the direction (that is, the slope) of the measurement signal from the detector, to be complementary to the form used in prior-art detectors.

Figure 15:
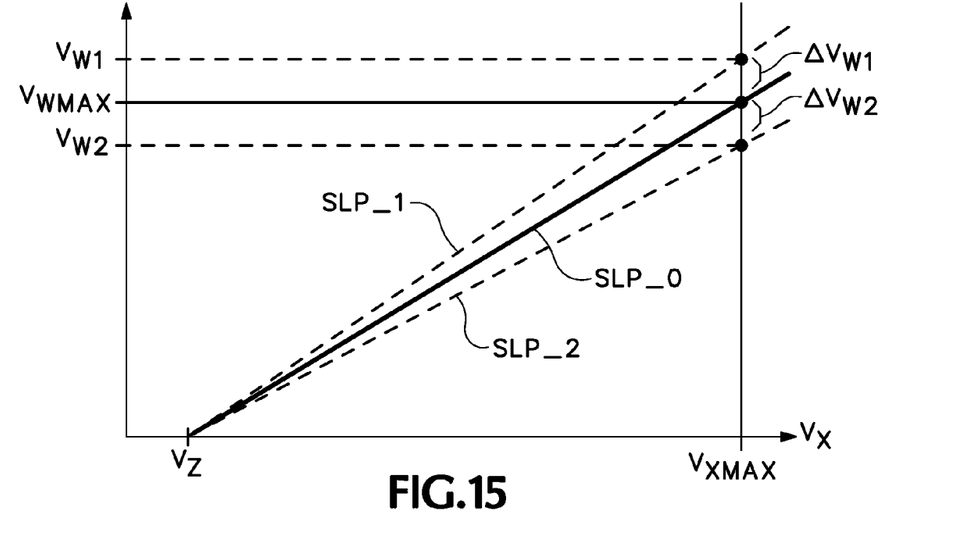
FIG. 15 illustrates the idealized transfer function of a prior-art log amp detector.

FIG. 15 illustrates the idealized transfer function of a prior-art log amp detector. The horizontal axis represents the RF input, in this case a voltage $V_X$, plotted on a decibel (dB) scale, and the vertical axis represents the output signal, in this case a voltage $V_W$, plotted on a linear scale. The response function shown here as SLP_0 is formally characterized by two parameters: the intercept, shown here as point $V_Z$, where the response function passes through zero; and the slope, which defines the change in output for any given change in the input. The intercept in this prior-art case is thus an aspect of the detector that relates to its minimum input and output. It can be viewed as a "hinge" of the line from which the slope "originates". (In a practical log amp, the output may not actually reach zero, in which case the intercept is an extrapolated value). Thus, for the response function SLP_0 the maximum value of $V_X$, the RF input signal, produces the maximum value of $V_W$, the measurement output signal.

An RF control system utilizing such a log amp thus requires the maximum power output to correspond to the maximum value of the set-point input. A problem with this arrangement is that, in a practical system, the detector and the device generating the set-point input (typically a DAC) will invariably utilize separate reference sources (usually voltages generated by on-chip band-gap circuits) to establish their respective scaling. Thus, for the log detector, its slope is typically specified as so many Volts (as defined by its internal reference source) per decibel; while for the DAC, its output scaling is typically specified as so many Volts (as defined by its internal reference source) per LSB (least significant bit). It will be apparent that the greatest error, expressed in decibels, will therefore occur the highest end of the power range, which is precisely where the accurate control of RF power is most critical.

FIG. 15 illustrates this for the log amp. An error in its reference source causes the slope of the response function to change as shown by SLP_1 or SLP_2. At the maximum RF input $V_{XMAX}$, the actual output might be as high as $V_{W1}$ or as low as $V_{W2}$. The largest inaccuracies, shown here as $\Delta V_{W1}$ and $\Delta V_{W2}$, or stated otherwise, the highest sensitivity to any errors in the individual reference sources, occur at the high end of the power-control range, where the most accuracy is required.

To address this fundamental source of error in transmitted power, an RF detector in accordance with the present invention is constructed such that its measurement output becomes progressively smaller as its RF input sample becomes progressively larger. Preferably, the output becomes very close to zero at the maximum input value. In this way, errors in either of the reference sources are essentially absent at high power levels, and the control accuracy is thus least affected by these elements.

To understand how one embodiment of such a log amp according to the present invention can be constructed, it is helpful to consider in some detail the structure and operation of the individual detector cells, associated with each stage of the complete multi-stage log amp. This may best be appreciated by reference to U.S. Pat. Nos. 4,990,803; 5,298,811; 5,345,185; 5,489,868; and 5,570,055 by the same inventor as the present patent application, describing high-accuracy prior-art log amps. In the transconductance detector cells used therein, their output current is arranged to increase as the output of its associated limiting amplifier cell increases with as the RF input signal level increases. At the maximum RF input level, all the detector cells are producing their maximum output current, which is defined by the internal reference source, and subsequently converted to the measurement signal, which is usually in the form of the aforementioned voltage, $V_{MEAS}$. Thus, the sensitivity to any errors in the reference source is highest at the top end of the power range, which has been shown to be the least favorable circumstance.

Figure 16:
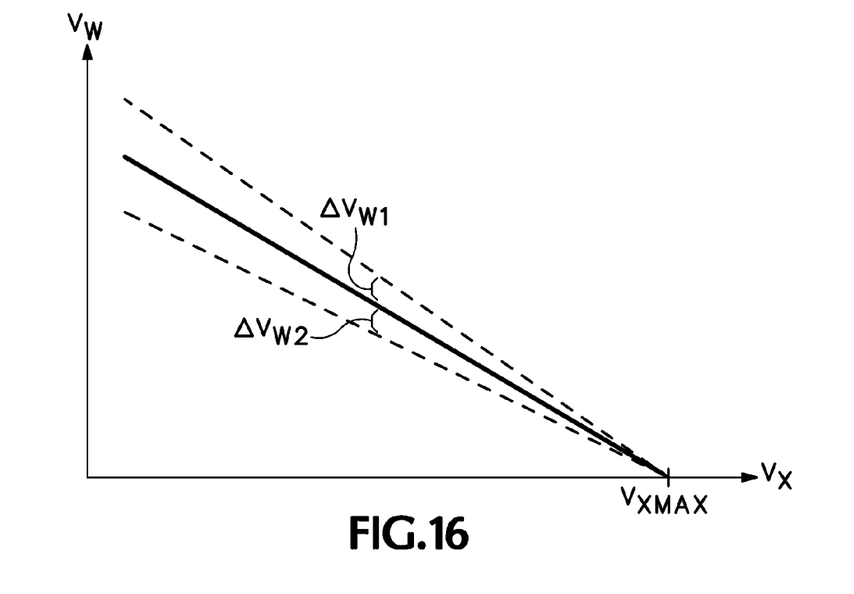
FIG. 16 illustrates the response function of a log amp according to the present invention.

This problem in circumvented in the present invention by arranging the transconductance detector cells to progressively turn off as the input signal becomes larger. That is, their output current is highest for zero RF input, and lowest (preferably almost zero) for the highest RF input, when all the amplifier stages are fully limited. The idealized response function of such a log amp according to the present invention is illustrated in FIG. 16. It is apparent that the slope of the response function (shown here as a solid line) is complementary to the prior-art function. A log amp so constructed has its intercept anchored at (or very close to) $V_{XMAX}$, that is, at maximum RF power. The slope of the response function is now negative, and the measurement output increases as the RF input diminishes. The maximum deviation due to any errors in the reference sources now occur at minimum power, where they are much more tolerable.

Figure 17:
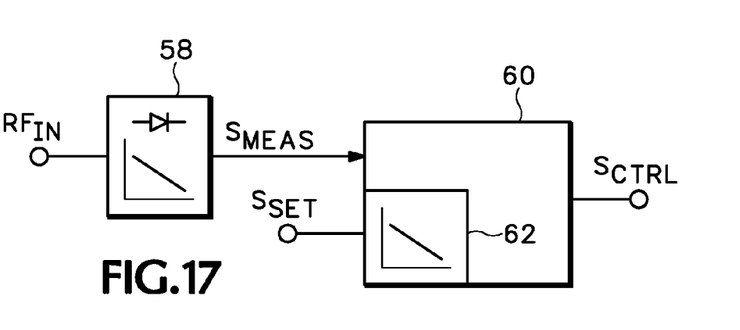
FIG. 17 illustrates an embodiment of an RF control system utilizing a detector with complementary slope polarity in accordance with the present invention.

While the principles of this particular aspect of the present invention have been illustrated by reference to a preferred log amp embodiment, they may be realized in many other ways. FIG. 17 illustrates an embodiment of an RF control system utilizing a detector with complementary slope polarity in accordance with the present invention. The detector 58 can be any suitable RF detector such as a log amp, squaring cell, etc., as long as it is constructed such that its output becomes progressively smaller (which specifically may mean, for example, less dependent on a scaling reference source) as its input becomes progressively larger. Because of the complementary polarity of the detector, the nulling circuit 60 is constructed to accommodate a set-point signal that also has a complementary polarity. In the embodiment of FIG. 17, the nulling circuit is shown with set-point interface 62 that is adapted to operate in response to a complementary set-point signal, $S_{SET}$.

For the lowest possible susceptibility to errors in the reference sources, the measurement output of the detector should preferably be as close as possible to zero at the maximum RF power level. However, the specific requirements of a control system in which such a detector is used may sometimes constrain the minimum permissible value of $V_{SET}$. For example, the DAC used to generate $V_{SET}$ may only operate down to a minimum output of 0.25V. To meet such a system requirement, a detector with a complementary slope polarity would be arranged to generate a measurement output of 0.25V, rather than zero, when the RF input signal is at its maximum value. This still represents a valuable eight-fold reduction in error compared to a prior-art system for which the full-scale output voltage from the DAC is typically 2.0 volts. That is, the sensitivity to any errors in the reference sources, in the detector and $V_{SET}$-generating DAC combined, is diluted by a factor of eight (2.0V/0.25V) in this example.

Figure 18:
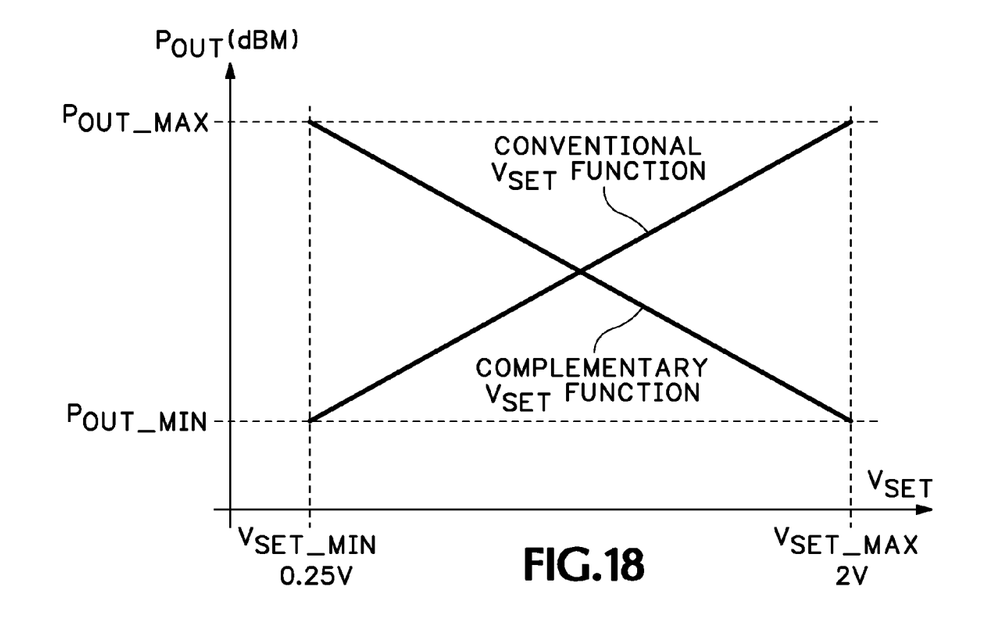
FIG. 18 illustrates conventional and complementary set-point signals in accordance with the present invention.

FIG. 18 illustrates how the maximum and minimum set-point signal might correspond to the maximum and minimum power levels in an embodiment of an RF control system using both conventional and complementary set-point signals in accordance with the present invention.

The utilization of a detector having a complementary slope polarity in an RF control system might require the use of a set-point signal having a complementary polarity. This can easily be provided by a simple change to the software, if $V_{SET}$ is provided by a DAC under system control. However, this code is typically embedded in a master ROM in the physical-layer controller of a digital telephony base-station or handset, and code modification can be expensive.

Figure 19:
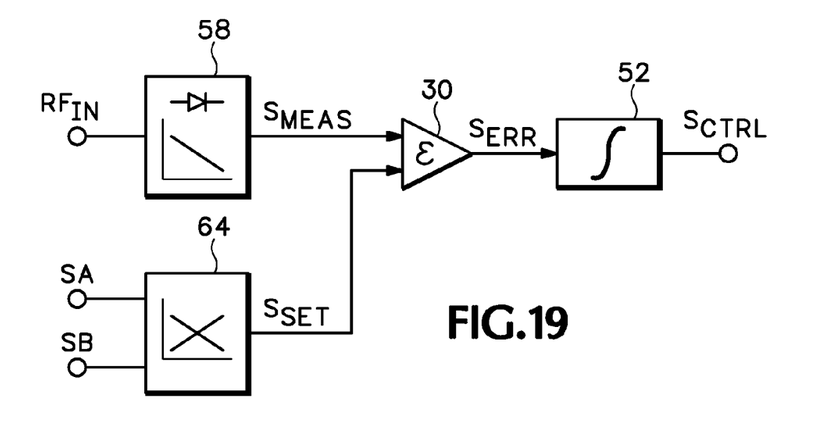
FIG. 19 shows another embodiment of an RF control system according to the present invention.

Therefore, to provide backward compatibility with existing transmission systems, another inventive principle of this patent application is to provide a set-point control interface that can be reconfigured for operation with either a conventional or a complementary set-point signal. This principle is illustrated in FIG. 19 which shows another embodiment of an RF control system according to the present invention. The system of FIG. 19 includes a detector 58 having a complementary slope polarity, an error generator 30 and an integrator 52. A quasi-differential set-point interface 64, having both inverting and non-inverting input terminals, can be configured to provide a response of the correct form in either the conventional or complementary mode. To complete a practical example of an embodiment of a control system according to the present invention, a reference voltage, $V_{REF}$, arranged to represent the full-scale value of $V_{SET}$, is made available. In the conventional slope mode, $V_{SET}$ is applied to the inverting input terminal of the set-point interface and the non-inverting input terminal is connected to $V_{REF}$. In the complementary slope mode, $V_{SET}$ is applied to the non-inverting input terminal and the inverting terminal is generally grounded.

Figure 20:
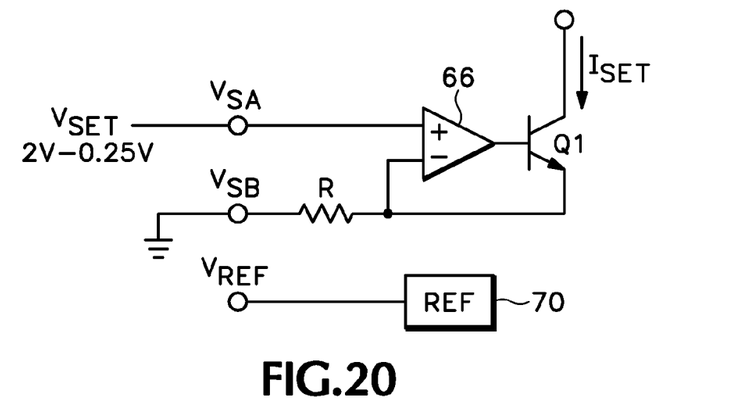
FIGS. 20 and 21 illustrate an example embodiment of a reconfigurable set-point interface according to the present invention.
Figure 21:
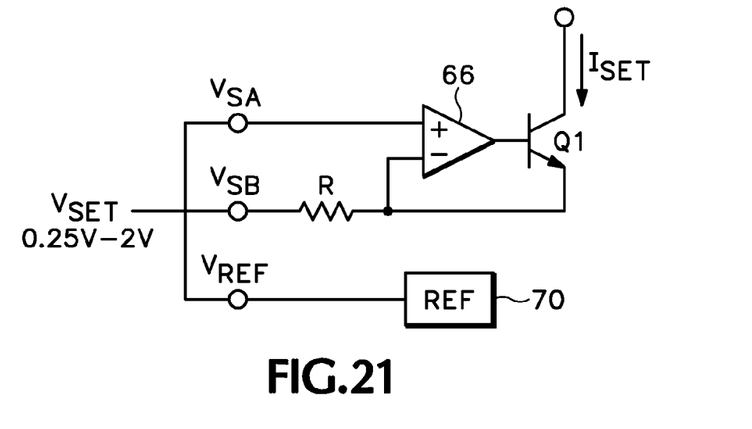

FIGS. 20 and 21 illustrate an example embodiment of a reconfigurable set-point interface according to the present invention. The embodiment of FIGS. 20 and 21 includes an op amp 66, a transistor Q1, a resistor R, and a voltage reference 70. In this example, the output signal is generated as a current $I_{SET}$ in at the collector of Q1. In FIG. 20, the interface is configured to receive a complementary set-point signal. The "B" input is grounded, the voltage reference is unused, and the set-point signal is applied to the "A" input wherein 2.0 volts represents a demand for minimum output and 0.25V represents a demand for maximum output. In this mode, the op amp 66 essentially operates as a unity gain buffer.

In FIG. 21, the interface has been reconfigured to receive a conventional set-point signal. The "A" input is connected to the voltage reference of, for example, 2.25V, and the set-point signal is applied to the "B" input of the op amp which now operates in an inverting mode, thereby reversing the polarity of the set-point signal. These voltage levels are, of course, for purposes of illustration only, and the inventive principals are not limited to the details of this embodiment.

Note that this system can be used as a power measurement-only system, rather than as a power controller, by closing the loop directly: the $V_{APC}$ terminal is connected to the $V_{SET}$ input terminal "A" and terminal "B" is grounded. Optionally, the log intercept can be either raised or lowered, by connecting terminal "B" to a positive or negative voltage source, respectively. Also, the log slope may be raised by inserting an resistive attenuator between $V_{APC}$ and terminal "A".

As with the principles of bandwidth compensation discussed above, the principles and benefits relating to the detector's complementary slope response (inverted slope polarity) are independent of other inventive principles of this patent application. Accordingly, the nulling circuit shown in FIG. 19 includes neither a track/hold stage nor a bandwidth compensation stage. The inventive principles relating to detector polarity may, however, be used in combination with other inventive principles disclosed in this application to achieve additional benefits.

Integrated RF Control System

Figure 22:
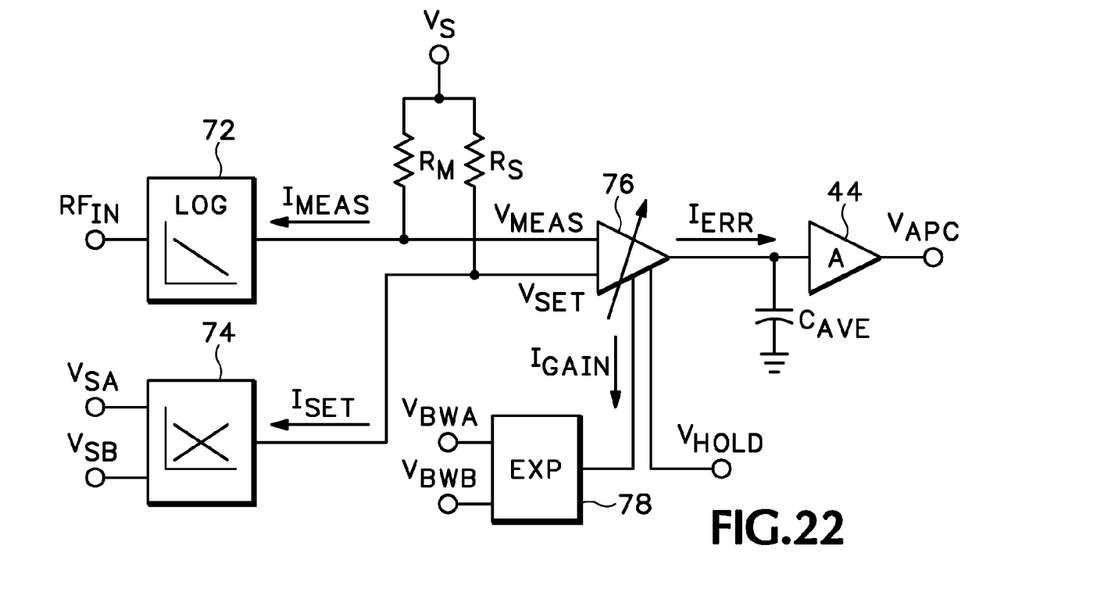
FIG. 22 illustrates an embodiment of an RF power-control system according to the present invention.

FIG. 22 illustrates a preferred embodiment of an RF power-control system that combines several of the independent inventive principles of this patent in a synergistic manner, so as to create a robust and versatile system, directly applicable to numerous systems, and suited to implementation in monolithic integrated circuit form.

The system of FIG. 22 includes a log amp 72 configured to provide the measurement signal in the form of the current $I_{MEAS}$ having the complementary slope response (inverted slope polarity). A set-point interface 74 can be configured to generate the set-point signal as a current $I_{SET}$ in response to a voltage applied to the quasi-differential input terminals $V_{SA}$ and $V_{SB}$, which may be used to provide either a conventional or a complementary set-point response.

Since the measurement and set-point signals are internally represented by currents, the error generator in the nulling circuit is reduced to a pair of resistors $R_M$ and $R_S$ that are anchored to an AC ground at the positive supply. These resistors convert the currents $I_{MEAS}$ and $I_{SET}$ to a differential error voltage $V_{MEAS}$, $V_{SET}$ which is then applied to the inputs of a VGA (variable gain amplifier) 76. Several functions of the nulling circuit are integrated into the VGA. First, it converts the error voltage to an error current which is more convenient to integrate in with capacitor $C_{AVE}$. Second, the VGA functions as the core of a bandwidth compensation element by multiplying the error signal by a gain signal $I_{GAIN}$. Third, it also serves as a track/hold switch by disconnecting the error current from the capacitor during hold mode responsive to the hold signal $V_{HOLD}$.

A variable bandwidth interface and exponential current generator 78 generates the gain signal $I_{GAIN}$ which has a linear-in-dB response to the voltage $V_{BWA}$, $V_{BWB}$ applied to the quasi-differential inputs to vary the forward gain (hence bandwidth) of the control loop.

A buffer amplifier having a gain "A" buffers the voltage across CAVE to generate the final control signal $V_{APC}$.

The log amp 72 is preferably implemented as a progressive-compression amplifier having gains stages with self-compensating gain such as those described in U.S. Pat. No. 6,144,244 by the same inventor as the present application. The log amp detector cells are preferably realized as any of the three-transistor cells described in U.S. Pat. No. 5,489,868, also by the same inventor as the present application. The detector cells can easily be arranged to so that the detectors turn off rather than on as the input signal increases.

In applications where accuracy is most important at the high end of the measurement range, special attention should be given to turning the detector cells off as decidedly as possible. In a preferred embodiment, this is accomplished by including emitter degeneration resistors in series with the emitters of the input differential pairs in the log amp gain stages. This, alone or in combination with increasing the tail current through the gain stages, extends the output voltage swing of each gain stage. By applying a greater voltage swing to the inputs of the detector cells, they can be switched off more completely.

The VGA 76 is preferably implemented as a transconductance cell that is biased by the gain signal $I_{GAIN}$. This has the effect of multiplying the error voltage by the bias current. The error voltage $V_{MEAS}$, $V_{SET}$ can be applied directly to the input terminals, but preferably, an emitter follower stage is interposed between the error generating resistors $R_M$, $R_S$ and the VGA. The track/hold function can be implemented by switching off the bias current to the transconductance cell or diverting it to ground when the hold signal $V_{HOLD}$ is activated. This disables the transconductance cell's ability to supply current to the capacitor and effectively opens the control loop. As long as the buffer amplifier 44 has a high enough input impedance, the voltage across $C_{AVE}$, and thus the control signal $V_{APC}$, will be held constant until the hold signal is deactivated.

The exponential current generator 78 is preferably based on a linear-in-dB cell of the type disclosed in U.S. Pat. No. 5,572,166 by the same inventor as the present application. The linear-in-dB cell can be prefaced by a quasi-differential interface similar to that described above with reference to FIGS. 20 and 21. This provides flexibility in the arrangement of the various signals that can be used to provide the bandwidth compensation function.

Figure 23:
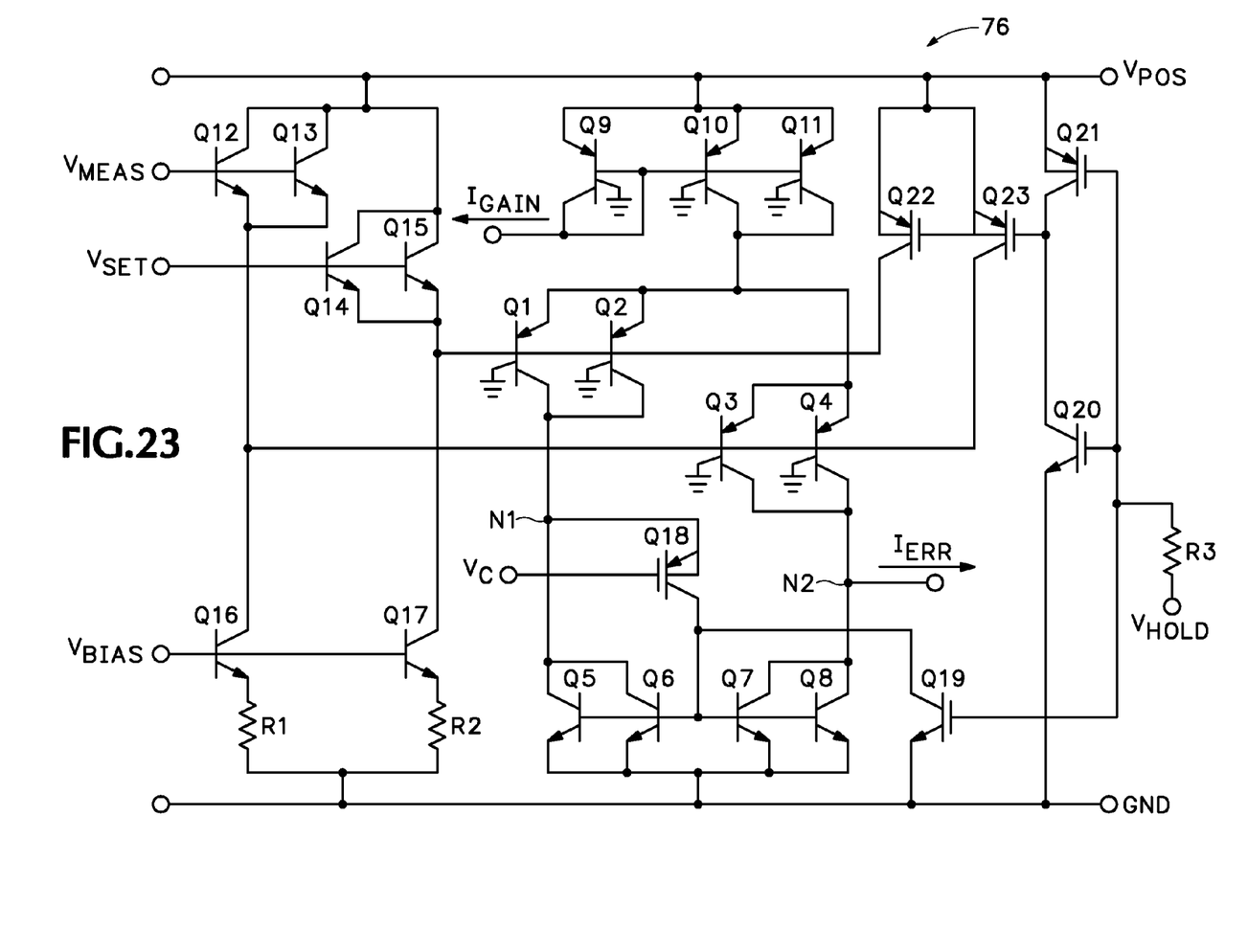
FIG. 23 illustrates an embodiment of a VGA according to the present invention.

FIG. 23 illustrates one possible example embodiment of the VGA of FIG. 22. The core of the circuit of FIG. 23 is a gm cell formed from cross-quadded PNP transistors Q1-Q4 which function as a differential pair and are loaded by a current mirror formed by cross-quadded NPN transistors Q5-Q8. The bias current (or "tail" current) through the gm cell is determined by $I_{GAIN}$ which is mirrored into the common emitters of Q1-Q4 through a current mirror formed by NPN transistors Q9-Q11. The gm cell is driven by the differential voltage $V_{MEAS}$, $V_{SET}$ through a pair of emitter-followers formed by cross-quadded NPN transistors Q12-Q15. The emitter followers are biased by current sources Q16,R1 and Q17,R2 in response to a bias signal $V_{BIAS}$. The error signal $I_{ERR}$ is taken from the node N2 between the collector of Q3,Q4 in the gm cell and the collector of Q7,Q8 in the load mirror, and applied to the integrating capacitor $C_{AVE}$.

The collector of Q5,Q6 at node N1 in the load mirror could be connected to the bases of Q5-Q6 as in a simple current mirror. As a further refinement, however, an NMOS transistor Q18 has its channel coupled between node N1 and the bases of Q5-Q6. The gate of Q18 is driven by a buffered version of the voltage at node N2, i.e., the voltage on the integrating capacitor. This helps maintain the collector of Q1-Q4 at the same voltage, thereby improving balance and allowing Q1-Q4 to be implemented with lateral PNP transistors which typically have poor alpha and Early voltage.

As explained above, the track/hold function can be implemented by switching off the bias current to the transconductance cell or diverting it to ground when the hold signal $V_{HOLD}$ is activated, thereby effectively opening the control loop. Such an approach, however, might result in unwanted charge injection into the integrating capacitor, thereby causing a step in the capacitor voltage. Therefore, the arrangement of transistors Q19-22 are included to provide clean switching and reduce charge injection. Resistor R3 provides transient protection and also beneficially slows down the switching edge on the hold signal $V_{HOLD}$ somewhat. When the hold signal switches from LO to HI (asserted), NMOS transistor Q19 pulls the bases of mirror transistors Q5-Q8 low, thereby turning them off quickly. At the same time, the hold signal is inverted by transistors Q20 (NMOS) and Q21 (PMOS). The inverted hold signal turns on PMOS transistors Q22 and Q23 by pulling their gates low, which in turn, pulls the bases of Q1-Q4 high, thereby cleanly turning off the gm cell. Because Q22 and Q23 are connected to the bases of Q1-Q4, they also divert the bias currents from Q16 and Q17 to the $V_{POS}$, thereby preventing voltage swings at the outputs of the emitter followers which could cause feed forward though to the output at node N2.

Figure 24:
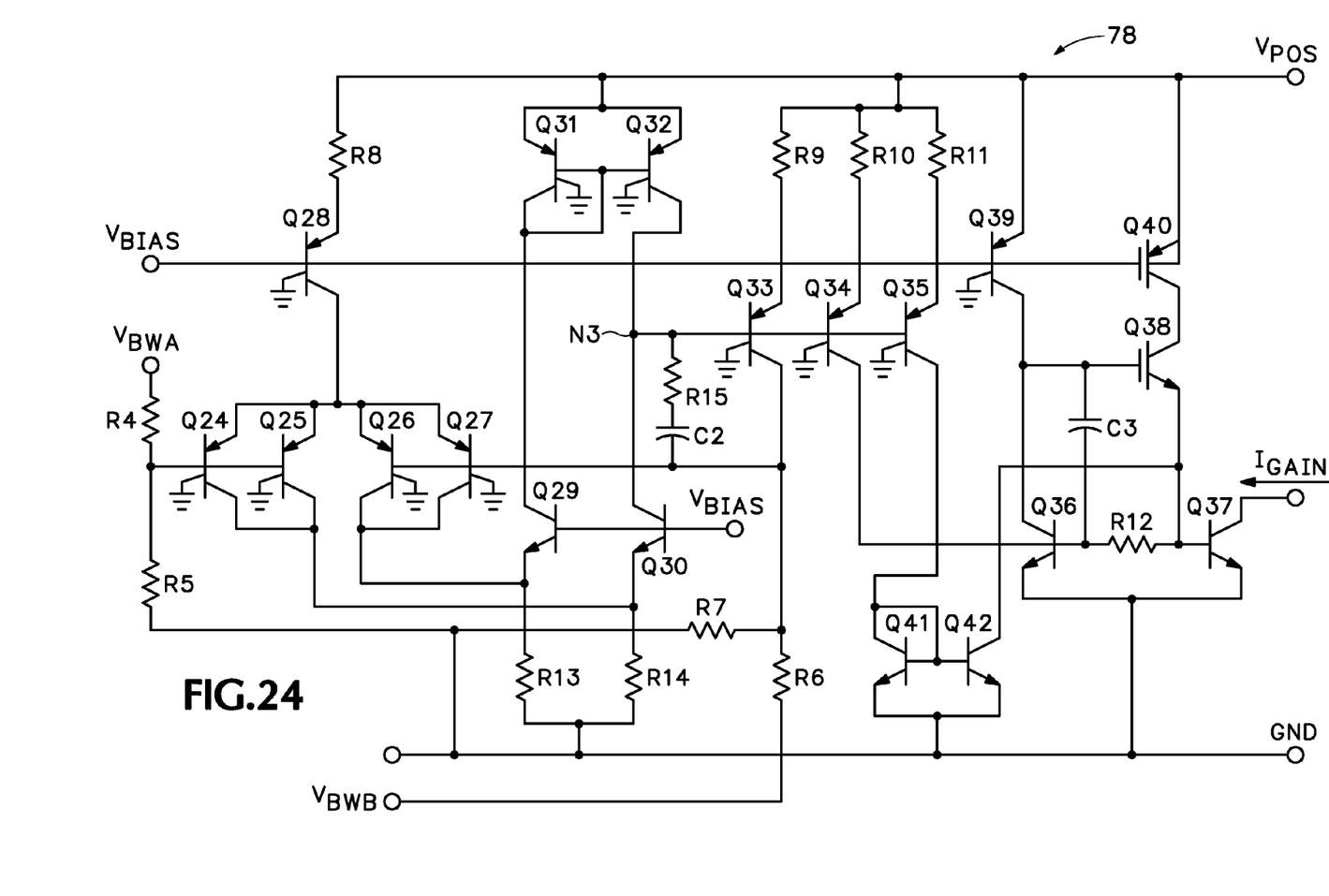
FIG. 24 illustrates an embodiment of variable bandwidth interface and exponential current generator according to the present invention.

FIG. 24 illustrates one possible example embodiment of the variable bandwidth interface and exponential current generator 78 of FIG. 22. The circuitry of FIG. 24 can generally be described as an operational amplifier (op amp) on the left side and an exponential (linear-in-dB) current generator on the right. The op amp includes an input stage formed from cross-quadded PNP transistors Q24-Q27 which function as a differential pair and loaded by resistors R9 and R10. The differential pair is biased by PNP transistor Q28 and resistor R8 in response to the bias signal $V_{BIAS}$. The variable bandwidth input signals $V_{BWA}$ and $V_{BWB}$ are attenuated by resistive dividers R4,R5 and R6,R7, respectively, and applied as a differential signal to the bases of the differential pair. The outputs from the differential pair are fully cascoded by NPN transistors Q29 and Q30 into a PNP current mirror Q31,Q32. The output from the cascode stage is coupled back to the "B" side input of the differential pair through an NPN transistor Q33 that is arranged such that the current through Q33 is forced to track the voltage difference between $V_{BWA}$ and $V_{BWB}$. The current through Q33 preferably has a zero temperature coefficient.

The current through Q33 is replicated in NPN transistor Q34 and applied to the linear-in-dB cell formed from NPN transistors Q36 and Q37 and resistor R12. This establishes the $\Delta V_{BE}$ between Q36 and Q37, and the exponential output from Q37 is utilized as the gain signal $I_{GAIN}$ As a further refinement, the current through Q33 is also replicated in another NPN transistor Q35 and provided to the base of Q37 through a current mirror that is formed from NPN transistors Q41 and Q42 and which may scale the current, for example, by a factor of 40 percent. An NMOS transistor Q38 is configured as a follower that completes the current mirroring scheme. Thus, current supplied by Q34 is also being consumed by Q42 so that Q38 always operates at the same bias.

Some of the embodiments disclosed in this patent application have been described with specific signals implemented as current-mode or voltage mode signals, but the inventive principles also contemplate other types of signals. Likewise, some transistors are described as being specifically NPN or PNP-type bipolar junction transistors (BJTs), but different polarities of BJTs can be utilized, as can CMOS or other types of devices. And although specific examples of some of the apparatus have been shown for purposes of illustration, numerous others can be devised in accordance with the inventive principles of this patent application. Some embodiments disclosed above have been described in the context of RF systems, but the inventive principles are not limited to use in RF systems. Some embodiments have also been described in the context of control systems, but it will be apparent that most such systems can also be operated in a measurement mode. Thus, the terms control system, control and controlling are also understood to mean measurement system, measurement and measuring as well, where applicable.

Numerous inventive principles have been described above, and each has independent utility. In some cases, additional benefits are realized when the principles are utilized in various combinations with one another.

Thus, the embodiments described herein can be modified in arrangement and detail without departing from the inventive concepts. Accordingly, such changes and modifications are considered to fall within the scope of the following claims.

The invention claimed is:

1. A system comprising:
   a detector to generate a measurement signal responsive to an input signal; and
   a nulling circuit coupled to the detector to generate a control signal responsive to the difference between the measurement signal and a set-point signal;
   wherein the nulling circuit comprises a bandwidth compensation stage to maintain the overall control loop bandwidth at a substantially constant value;
   wherein the nulling circuit comprises an error generator and an integrator;
   wherein the error generator and the bandwidth compensation stage comprise a variable gain amplifier having a first input coupled to receive the measurement signal, a second input coupled to receive the set-point signal, an output to provide an error signal in response to the measurement signal and the set-point signal, and an analog gain-control input to vary the gain of the amplifier in response to a gain control signal; and
   wherein the variable gain amplifier comprises an operational amplifier and an exponential signal generator.

2. An RF power detector having an output signal that decreases in magnitude in response to an increasing input signal; wherein the RF power detector comprises a series of transconductance detector cells arranged to progressively turn off as the input signal becomes progressively larger; and wherein the output signal has the form A-X, where A is a constant and X is the function of the detector response, wherein X is a logarithmic function.

* * * * *